Nov. 13, 1956 W. V. B. ROBERTS 2,770,782

FREQUENCY SELECTIVE COUPLING SYSTEM

Filed Aug. 30, 1952

INVENTOR.

WALTER VAN B. ROBERTS

BY Charles H. Brown

ATTORNEY

United States Patent Office 2,770,782

Patented Nov. 13, 1956

2,770,782

FREQUENCY SELECTIVE COUPLING SYSTEM

Walter van B. Roberts, Princeton, N. J., assignor to Radio Corporation of America, a corporation of Delaware Application August 30, 1952, Serial No. 307,304

6 Claims. (Cl. 333—71)

This invention relates to band-pass filters and more particularly to frequency selective coupling means for use in signal amplifying systems, the coupling means including a mechanical resonator.

One application of the present invention is in radio receivers. It is the usual practice in radio receivers operating according to the superheterodyne principle to employ stages of intermediate frequency amplification. The intermediate frequency stages are required to effect an amplification of signals having frequency components in a band centered about the intermediate frequency. The system should be such that the frequency components in the desired band are amplified equally and that frequency components outside the band are substantially completely attenuated in order to prevent interference from signals other than the ones desired.

Intermediate frequency transformers are commonly used to provide the frequency selective coupling which is required between the stages of an intermediate frequency amplifier. Transformers are relatively expensive to manufacture, they require the use of a signal generator when realignment is necessary, and they do not provide as sharp an attenuation of frequency components immediately outside the predetermined pass-band as could be desired. It is therefore an object of this invention to provide a coupling system having the advantages attendant upon the inclusion of a mechanical resonator.

It is another object of the invention to provide a novel band-pass filter system having the property of very greatly attenuating frequency components immediately outside of the pass-band.

It is a further object to provide an interstage coupling system which is easily adjusted or aligned to a predetermined frequency.

It is a further object to provide an interstage coupling system characterized by very high quality performance together with simplicity and economy of manufacture.

It is a still further object to provide a frequency selective circuit introducing negligible losses and including a mechanical resonator.

Pursuant to the teachings of this invention there is provided an interstage coupling system comprising three circuit branches connected in electrically parallel relation. The input and output branches each consist of a capacitor and an inductor connected in series. The intermediate branch consists of a capacitor and an inductor in series, the inductor being wound about a coaxially arranged annular resonator preferably made of ferrite. The inductor may also surround two ferrite cores, the annular resonator being disposed between the two cores.

In another aspect, the invention includes a magnetostrictive resonator of configuration other than annular, the resonator being biased by magnetic lines of force from a permanent magnet.

These and other objects, advantages, features and aspects of the invention will be apparent to those skilled in the art to which the invention pertains from the following description taken in conjunction with the appended drawings.

Figures 1, 2, 3, 4:
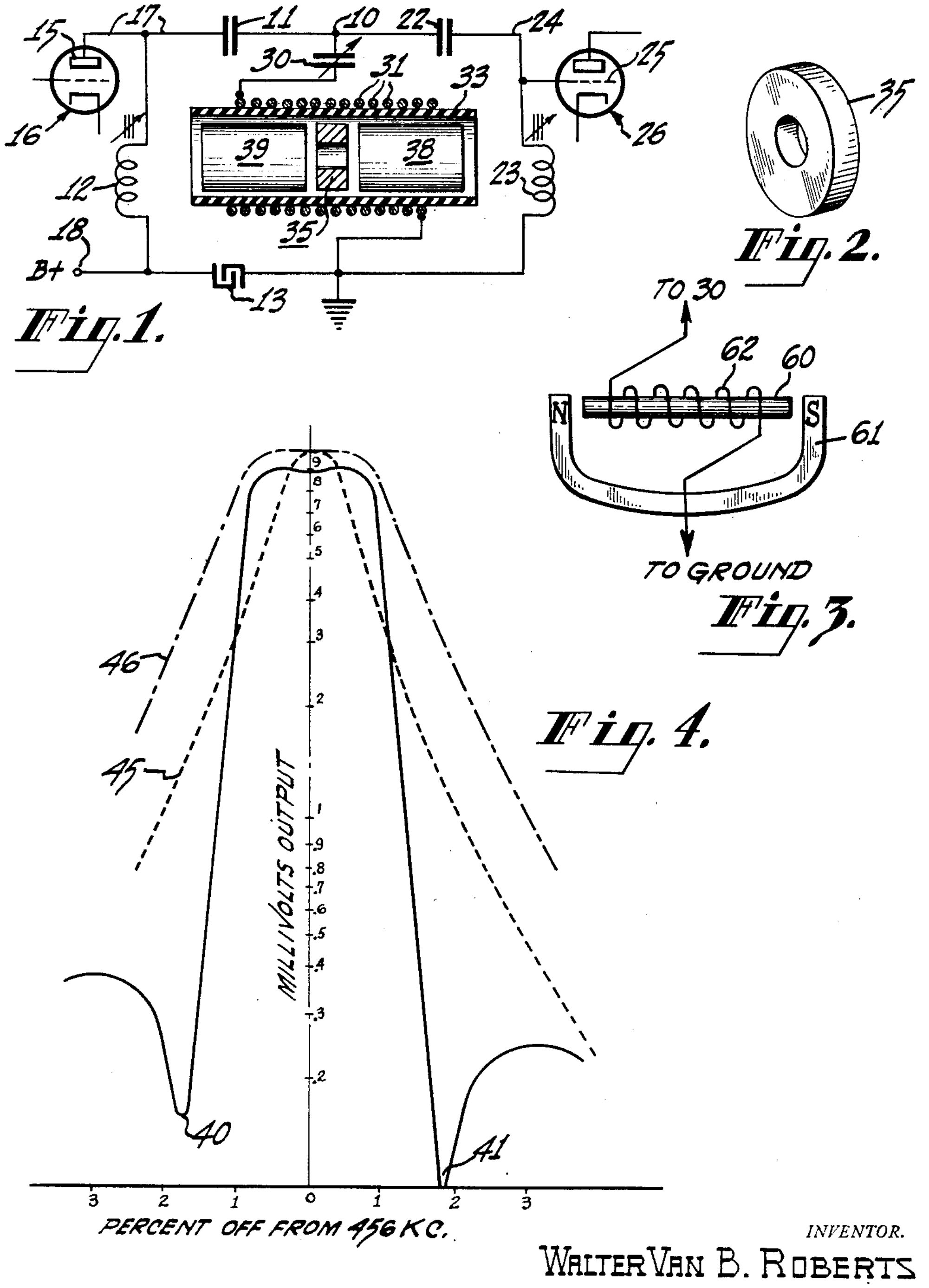
Fig. 1 is a circuit diagram of a frequency selective coupling circuit including a magnetostrictive device, the device being portrayed in physical form rather than by symbol.
Fig. 2 is a perspective view of a annular resonator element such as is included in Figure 1.
Fig. 3 is a representation of a magnetostrictive device which may be substituted for that shown in Figure 1.
Fig. 4 is a chart showing the frequency selective characteristics of the circuit of Fig. 1 in comparison with the characteristics obtainable with a conventional interstage coupling transformer.

Fig. 1 shows a frequency selective coupling circuit interposed between two vacuum tube stages of a signal amplifying system. While not limited thereto, the coupling system is useful between the intermediate frequency stages of a superheterodyne receiver. The circuit may be thought of as having three branches in parallel between point 10 and ground. The input or first branch includes a capacitor 11, an inductor 12 and a B+ isolating capacitor 13, all connected in series between point 10 and ground. The anode 15 of vacuum tube 16 is connected for radio frequencies through wire 17 and capacitor 11 to junction point 10. Anode 15 is supplied with anode voltage from the positive terminal B+ of a source 18 through inductor 12.

The output branch of the circuit consists of a capacitor 22 and an inductor 23 connected in series between junction point 10 and ground. The junction between capacitor 22 and inductor 23 is connected by wire 24 to the grid 25 of vacuum tube 26.

The third or intermediate branch of the circuit consists of a variable capacitor 30 and a magnetostrictive device including an inductor 31 connected between junction point 10 and ground. Inductor 31 is wound on a cylindrical coil form 33 made of insulating non-magnetic material. A magnetized annular resonator element 35 made of ferrite is positioned coaxially and centrally within the coil form 33. The inductor 31, coil form 33, and resonator 35 are shown in cross section. The configuration of annular resonator element 35 is more clearly apparent in the perspective view of Figure 2. Cylindrical cores 38 and 39 made of a permeable but unmagnetized material are disposed coaxially within coil form 33, one being on one side of resonator element 35 and the other being on the opposite side of resonator 35. Cylindrical cores 38 and 39 are preferably of unmagnetized ferrite and are for the purpose of increasing the coefficient of coupling between inductor 31 and annular resonator element 35. The resonator 35 and cores 38, 39 are held in light contact with each other by means (not shown) such as caps on the ends of coil form 33 and a spring or stuffing material.

In this description, the resonator element 35 is considered to be properly biased by a magnetic field. Methods of permanently magnetizing ferrite rings in closed loops, which rings are suitable for use in the coupling system of this invention, are disclosed and claimed in Patent No. 2,736,824, issued to me on Feb. 28, 1956. As an indication of a suitable material for resonator 35, a ferrite consisting of 74.69 grams of NiO and 159.68 grams of $Fe_2O_3$ heated to 1400 degrees centigrade for one and one-half hours and then slowly cooled has been found to be quite good in all respects.

The axial length of annular resonator element 35 determines its inherent frequency of oscillation in the torsional mode. The element 35 is cut to dimensions which result in the desired frequency of oscillation, which may, for example, be a frequency of 456 kilocycles. To give an idea of physical size, the coil form 33 may be in the order of one inch in length and one-third inch in diameter. The resonator 35 may have an axial length of about one-eighth inch depending upon the frequency characteristic desired.

The width of the band of frequencies passed by the circuit is determined by the coefficient of coupling between inductor 31 and the resonator element 35. The unmagnetized ferrite cores 38 and 39 increase the pass-band by increasing the coefficient of coupling between inductor 31 and element 35, the coefficient of coupling being equal to the frequency separation of rejection points 40 and 41 of the solid curve of Figure 4, divided by the mid-band frequency. Therefore, the size and positions of cores 38 and 39 may be such as to provide the desired pass-band width, or one or both may be omitted entirely where a narrow pass-band is desired.

In the construction of a coupling system such as that shown in Figure 1, the values of capacitor 11 and inductor 12, and the values of capacitor 22 and inductor 23, are chosen to provide series resonant circuit branches between junction 10 and ground which resonate at the mid-point frequency of the desired pass-band. This frequency will be the one already determined by the axial length of the annular resonator element 35. The Q of inductors 12 and 23 should be made equal to the mid-point frequency divided by the desired band width, the exact value of Q being chosen to give the characteristic curve of the filter a desired shape in the pass-band. Capacitors 11 and 22 may be of the same value, and inductors 12 and 23 may be of the same value. The ratio of inductors 12 and 23 to inductor 31 may be determined from the relationship: the pass-band=the ratio of frequency separation of the rejection points to the center frequency divided by $$\sqrt{1+\frac{L_{12}}{2L_{31}}}=$$

the coefficient of coupling between inductor 31 and resonator 35 divided by $$\sqrt{1+\frac{L_{12}}{2L_{31}}}$$

The value of capacitor 30, in the third or intermediate branch of the circuit, is selected so that the rejection points 40 and 41 in Figure 4 fall outside the pass-band at approximately equal distances on each side of the center frequency. The Q of inductor 31 should be as high as possible. As indicated in Fig. 1, there is zero or negligible mutual inductance coupling between all three of the branches. This is desirable to attain the maximum filtering effect from the intermediate branch. Any mutual inductance coupling between the branches might result in the intermediate branch being bypassed, with a corresponding reduction in the filtering action.

The solid curve in Figure 4 represents the characteristics of a coupling circuit such as that shown in Figure 1, the circuit being designed for a mid-frequency of 456 kilocycles and a pass-band of roughly two percent of the center frequency. Figure 4 also shows, for purposes of comparison, the characteristics of the coupling circuit in the form of an ordinary intermediate frequency transformer constituting a primary circuit including a capacitor 11 and an inductor 12 and a secondary circuit including a capacitor 22 and an inductor 23. Dashed curve 45 shows the characteristics obtainable when inductors 12 and 23 are loosely coupled, and dashed and dotted curve 46 shows the characteristics obtainable with critical coupling between inductors 12 and 23. It is apparent from a comparison of curves in Figure 4 that the solid curve representing the results obtained with the circuit in Figure 1 is greatly superior to the results obtainable with an intermediate frequency transformer wherein the coupling is by simple mutual inductance.

The inherent frequency constancy of the ferrite resonator 35 makes it possible to tune this filter in a radio receiver without requiring a signal generator to provide the proper intermediate frequency. The input and output circuits are first detuned, and any strong signal is tuned in. This will peak up sharply at the ferrite resonator frequency, so that the desired intermediate frequency is known to be impressed on the filter. Next the junction point 10 is shorted to ground so that input and output circuits are only very loosely coupled by the inductance of the shorting lead. They may therefore be peaked independently by adjustment of powdered metal cores in inductors 12 and 23. On removing the short, the filter is in tune except for variable capacitor 30 which must next be adjusted so that the rejection points fall outside the transmission band, preferable at approximately equal distances on each side. The spacing between rejection points is not adjustable except in the original construction at which time the coefficient of coupling is fixed.

Fig. 3 illustrates another form of magnetostrictive device which may be inserted in the third or intermediate branch of the circuit of Figure 1 in place of the device shown. In this form of the invention a magnetostrictive ferrite resonator 60 is supported in a magnetic field produced by a permanent magnet 61. A coil 62 is wound around the ferrite resonator 60 and is connected at one end to ground and at the other end to capacitor 30. It may be noted that in this form of the invention it is necessary to provide a biasing magnetic field through the magnetostrictive resonator 60, which source of bias is not needed in the form of resonator shown in Figure 1. Here again, the physical dimensions of the resonator element 60 determine the frequency of oscillation and the coupling between coil 62 and element 60 determines the width of the pass-band of the coupling circuit.

What is claimed is:

1. A band-pass filter circuit comprising three tuned branches connected in electrically parallel relation without mutual inductance coupling therebetween, one of said branches comprising a capacitor and an inductor in series, an annular resonator of magnetostrictive material disposed within said inductor, and a core of magnetic material positioned within said inductor to increase the magnetic coupling between said inductor and said resonator.

2. A frequency-selective circuit comprising three tuned branches connected in parallel without mutual inductance coupling therebetween, one of said branches comprising a capacitor and an inductor in series, an annular resonator of ferrite centrally disposed within said inductor, and two cores of ferrite positioned within said inductor on either side of said annular resonator.

3. A band-pass filter circuit comprising three tuned branches connected in electrically parallel relation without mutual inductance coupling therebetween, one of said branches comprising a capacitor and an inductor in series, an annular resonator of ferrite disposed within said inductor in coaxial relationship therewith, and a core of permeable material within said inductor to increase the magnetic coupling between said inductor and said resonator.

4. A frequency-selective circuit comprising three tuned branches connected in electrically parallel relation without mutual inductance coupling therebetween, one of said branches comprising a capacitor and an inductor in series, and a circularly-magnetized annular resonator of ferrite disposed within said inductor in coaxial relationship therewith, whereby said annular resonator resonates in the torsional mode.

5. A frequency-selective coupling circuit, comprising an input circuit, an output circuit, and an intermediate circuit connected in electrically parallel relationship with said input and said output circuits and physically positioned between said input and said output circuits so that there is negligible mutual inductance coupling between any of said circuits; said input circuit having a capacitor and an inductor connected in series and tuned to a predetermined frequency; said output circuit having a capacitor and an inductor connected in series and tuned to said predetermined frequency; and said intermediate circuit having a capacitor and an inductor connected in series, said inductor of said intermediate circuit being wound on a cylindrical form of insulating non-magnetic material; a permanently biased annular magnetostrictive resonator element positioned coaxially and centrally within said form, said element having dimensions at which its inherent frequency of oscillation in the torsional mode is the same as said predetermined frequency; and two cylindrical unmagnetized and permeable cores, one of said cores positioned coaxially within said form on each side of said element for varying the coefficient of coupling between said element and said inductor of said intermediate circuit.

6. A frequency-selective coupling circuit comprising an input circuit an output circuit, and an intermediate circuit connected in electrically parallel relationship with said input and said output circuits and physically positioned between said input and said output circuits so that there is negligible mutual inductance coupling between any of said circuits; said input circuit having a capacitor and an inductor connected in series and tuned to a predetermined frequency; said output circuit having a capacitor and an inductor connected in series and tuned to said predetermined frequency; and said intermediate circuit having a capacitor and an inductor connected in series, said inductor of said intermediate circuit being wound on a cylindrical form and positioned between said input and said output circuits and physically spaced therefrom with its cylindrical axis at right angles to said inductors of said input and said output circuits; a permanently biased annular magnetostrictive resonator element positioned coaxially and centrally within said form, said element having dimensions at which its inherent frequency of oscillation in the torsional mode is the same as said predetermined frequency; and two cylindrical unmagnetized and permeable cores, one of said cores positioned coaxially within said form on each side of said element for varying the coefficient of coupling between said element and said inductor of said intermediate circuit.

References Cited in the file of this patent

UNITED STATES PATENTS

| | | |
|---|---|---|
| 1,850,831 | Elliott | Mar. 22, 1932 |
| 2,052,703 | Farnham | Sept. 1, 1936 |
| 2,166,359 | Lakatos | July 18, 1939 |
| 2,167,079 | Landon | July 25, 1939 |
| 2,227,590 | Landon | Jan. 7, 1941 |
| 2,592,721 | Mott | Apr. 15, 1952 |
| 2,599,068 | Potter | June 3, 1952 |
| 2,660,712 | Landon | Nov. 24, 1953 |
| 2,692,344 | van der Burgt et al. | Oct. 19, 1954 |